United States Patent
Ali et al.

(10) Patent No.: US 11,785,744 B2
(45) Date of Patent: *Oct. 10, 2023

(54) REINFORCED GRAPHITE HEAT-SPREADER FOR A HOUSING SURFACE OF AN ELECTRONIC DEVICE

(71) Applicant: Google LLC, Mountain View, CA (US)

(72) Inventors: Ihab A. Ali, Cupertino, CA (US); Duen Hsing Hsieh, Taipei (TW)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,351

(22) Filed: Apr. 25, 2022

(65) Prior Publication Data

US 2022/0248562 A1    Aug. 4, 2022

Related U.S. Application Data

(63) Continuation of application No. 16/943,929, filed on Jul. 30, 2020, now Pat. No. 11,317,538.

(51) Int. Cl.
*H05K 7/20* (2006.01)

(52) U.S. Cl.
CPC ................... *H05K 7/2039* (2013.01)

(58) Field of Classification Search
CPC ......... H05K 2201/10106; H05K 1/189; H05K 3/323; H05K 1/0203; H05K 1/0204; H05K 2201/09036; H05K 2203/302; H05K 3/20; H05K 1/0206; H05K 7/2039; H05K 7/20427; H05K 3/4644; H05K 2201/09054

See application file for complete search history.

(56) References Cited

U.S. PATENT DOCUMENTS

| | | | |
|---|---|---|---|
| 4,888,247 A | 12/1989 | Zweben et al. | |
| 8,537,554 B1 * | 9/2013 | Hockaday | H01L 23/467 136/246 |
| 9,961,809 B1 | 5/2018 | Yoon et al. | |
| 2004/0118579 A1 * | 6/2004 | McCutcheon | F28D 15/0241 174/16.3 |
| 2005/0281000 A1 | 12/2005 | Chu et al. | |

(Continued)

FOREIGN PATENT DOCUMENTS

CN    106414649    2/2017

OTHER PUBLICATIONS

Notice of Allowance dated Dec. 3, 2021 in U.S. Appl. No. 16/943,929.

(Continued)

*Primary Examiner* — Adam B Dravininkas
(74) *Attorney, Agent, or Firm* — Kilpatrick Townsend & Stockton LLP (57) ABSTRACT

This document describes a reinforced graphite heat-spreader for a surface of a housing component of an electronic device. The reinforced graphite heat-spreader includes a heat-spreader material stack having a layer of graphite material to spread heat. The reinforced graphite heat-spreader also includes an interface material stack that joins the heat-spreader material stack to the housing surface of an electronic device. The interface material stack, which may be formed using embossing techniques, includes protuberances that may be formed from an adhesive material.

20 Claims, 9 Drawing Sheets

(56) References Cited

U.S. PATENT DOCUMENTS

| | | |
|---|---|---|
| 2006/0056157 A1* | 3/2006 | Ford .................. G06F 1/203 |
| | | 257/E23.11 |
| 2006/0126304 A1 | 6/2006 | Smalc et al. |
| 2006/0238984 A1* | 10/2006 | Belady ................ H01L 23/367 |
| | | 257/E23.098 |
| 2007/0231560 A1 | 10/2007 | Zhang et al. |
| 2009/0117373 A1* | 5/2009 | Wisniewski ....... H01L 23/3735 |
| | | 427/190 |
| 2013/0265721 A1 | 10/2013 | Strader et al. |
| 2014/0370222 A1 | 12/2014 | Kim et al. |
| 2015/0040977 A1 | 2/2015 | Kanuga et al. |
| 2015/0118514 A1 | 4/2015 | Zhao et al. |
| 2015/0334871 A1 | 11/2015 | Hill et al. |
| 2016/0160096 A1 | 6/2016 | Hirose et al. |
| 2018/0072920 A1* | 3/2018 | Kaneda ................ B32B 27/30 |
| 2019/0010367 A1 | 1/2019 | Pucci et al. |
| 2019/0270259 A1 | 9/2019 | Gans |
| 2020/0008316 A1* | 1/2020 | Cola .................... H01L 23/373 |
| 2021/0265602 A1* | 8/2021 | Sakio .................... H01L 51/56 |
| 2021/0363653 A1* | 11/2021 | Hotta .................... C25D 11/20 |

OTHER PUBLICATIONS

Office Action dated Sep. 14, 2021 in U.S. Appl. No. 16/943,929.

Panasonic Electronic Devices Co, "Basic Properties and Application Examples of PGS Graphite Sheet", last accessed Apr. 24, 2020, pp. 1-16, available at: htttps://www.mouser.com/pdfdocs/thermalgraphitesheets.pdf.

Xiong et al., "Thermal Tests and Analysis of Thin Graphite Heat Spreader for Hot Spot Reduction in Handheld Devices", GrafTech International Holdings Inc., Jun. 2008, pp. 1-8.

* cited by examiner

REINFORCED GRAPHITE HEAT-SPREADER FOR A HOUSING SURFACE OF AN ELECTRONIC DEVICE

CROSS-REFERENCE TO RELATED APPLICATION

This application is a continuation of U.S. patent application Ser. No. 16/943,929, filed Jul. 30, 2020, which is hereby incorporated by reference herein in its entirety.

BACKGROUND

Consumer electronic devices may use graphite heat spreaders for thermal management. For example, an electronic device may include a graphite heat spreader that is laminated to a surface of a housing component of the electronic device to manage a heat load that is generated by internal, heat-generating devices of the electronic device. The graphite heat spreader may rapidly spread and transfer, through a thermal conduction heat transfer mechanism, the heat load to the housing component so that the housing component may dissipate the heat load to an external environment through a thermal convection heat transfer mechanism.

During qualification testing, the electronic device, including the graphite heat spreader laminated to the surface of the housing component, may be subject to reliability testing that includes thermal cycling. For example, the reliability testing may include placing the electronic device into a chamber having an environment that cycles from −20 degrees Celsius (° C.) to 60° C.

During thermal cycling, several factors may compromise the lamination of the graphite heat spreader to the surface of the housing component. For example, mismatches in coefficients of thermal expansion (CTEs) of materials included in the heat spreader may contribute to interlaminar stresses and shear forces that wrinkle the heat spreader, causing delamination, which separates portions of the heat spreader from the surface of the housing component. Furthermore, if the housing is formed from a plastic material, the plastic material may expel gases through outgassing. The expelled gases may result in bubbles trapped between the surface of the housing component and the graphite heat spreader, effective to cause further delamination.

Under such conditions, portions of delamination and/or bubbling between the surface of the housing component and the graphite heat spreader can switch thermal transfer mechanisms between the heat spreader and the housing surface of the housing component. The heat transfer mechanisms, in regions of delamination, can change from a thermal-conduction heat transfer mechanism to a thermal-convection heat transfer mechanism. This change, from using a thermal-conduction heat transfer mechanism to using a thermal-convection mechanism, increases thermal resistances in the regions of delamination and/or bubbling, reducing an efficiency and effectiveness with which the graphite heat spreader transfers the heat load to the surface of the housing component.

SUMMARY

This document describes a reinforced graphite heat-spreader for a surface of a housing component of an electronic device. The reinforced graphite heat-spreader includes a heat-spreader material stack having a layer of graphite material to spread heat. The reinforced graphite heat-spreader also includes an interface material stack that joins the heat-spreader material stack to the housing surface of an electronic device. The interface material stack, which may be formed using embossing techniques, includes protuberances that may be formed from an adhesive material.

In some aspects, an electronic device is described. The electronic device includes a reinforced graphite heat-spreader joined to a non-planar surface of a housing component of the electronic device. The reinforced graphite heat-spreader includes a heat-spreader material stack having a layer of graphite material. The reinforced graphite heat-spreader also includes an interface material stack that joins the non-planar surface region of the housing to the heat-spreader material stack. The interface material stack includes a layer of a second polymer material having a first side and a second side that is opposite the first side. The interface material stack also includes a matrix of protuberances that is formed on the first side of the layer of the second polymer material to join the non-planar surface region of the housing to the first side of the layer of the second polymer material. The interface material stack further includes a layer of a second adhesive material that is formed on the second side of the layer of the second polymer material to join the heat-spreader material stack to the second side of the layer of the second polymer material.

In other aspects, another electronic apparatus is described. The other electronic apparatus includes a housing having a surface region and a reinforced graphite heat-spreader. The reinforced graphite heat-spreader includes a layer of a first polymer material having a nominal thickness, a layer of a graphite material, and a layer of a first adhesive material between the layer of the first polymer material and the layer of the graphite material. The layer of the first adhesive material has another nominal thickness that is approximately one-half of the nominal thickness of the first layer of the first polymer material. The reinforced graphite heat-spreader also includes an interface material stack that joins the surface region of the housing to the heat-spreader material stack.

In yet other aspects a method of forming a reinforced graphite heat-spreader is described. The method includes coating, onto a first side of a layer of a polymer material, a layer of a first adhesive material and curing, in accordance with a curing profile, the layer of the first adhesive material. The method continues to include mating, into the cured layer of the first adhesive material, an embossing liner having a raised pattern and, subsequently, removing the embossing liner to reveal a matrix of protuberances that extends from the first side of the layer of the polymer material. The method further includes coating, onto a second side of the layer of the polymer material that is opposite the first side, a layer of a second adhesive material to render an interface material stack. The interface material stack is joined to a heat-spreader material stack to render the reinforced graphite heat-spreader.

The details of one or more implementations are set forth in the accompanying drawings and the following description. Other features and advantages will be apparent from the description, the drawings, and the claims. This summary is provided to introduce subject matter that is further described in the Detailed Description. Accordingly, a reader should not consider the summary to describe essential features nor threshold the scope of the claimed subject matter.

BRIEF DESCRIPTION OF THE DRAWINGS

The details of one or more aspects of a reinforced graphite heat-spreader for a housing surface of an electronic device are described below. The use of the same reference numbers in different instances in the description and the figures indicate similar mechanisms.

DETAILED DESCRIPTION

This document describes a reinforced graphite heat-spreader for a surface of a housing component of an electronic device. The reinforced graphite heat-spreader includes a heat-spreader material stack having a layer of graphite material to spread heat. The reinforced graphite heat-spreader also includes an interface material stack that joins the heat-spreader material stack to the housing surface of an electronic device. The interface material stack, which may be formed using embossing techniques, includes protuberances that may be formed from an adhesive material.

While features and concepts of the described reinforced graphite heat-spreader can be implemented in any number of different environments and devices, aspects are described in the context of the descriptions and examples below.

Heat transfer, in general, is energy that is in transit due to a temperature difference. If one or more temperature differences exist across components of a system, heat (e.g., energy in Joules (J)) will transfer from higher temperature zones to lower temperature zones to minimize the temperature differences. There are several mechanisms for heat transfer across the components of a system to minimize temperature differences, including convection, radiation, and conduction.

Convection, or heat transfer from a surface due to movement of molecules within fluids such as gases and liquids, can be quantified by equation (1) below:

$$q_{conv} = hA(T_s - T_\infty) \tag{1}$$

For equation (1), $q_{conv}$ represents a rate of heat transfer from a surface through convection (e.g., in J per second or Watts (W)), h represents a convection heat transfer coefficient (e.g., in W per meter squared (W/m²)), $T_s$ represents a temperature of a surface (e.g., in Kelvin (K) or ° C.), and $T_\infty$ represents a temperature of a fluid (e.g., in K or ° C.) to which the surface is exposed. The term A represents the area of a surface (e.g., in m²).

Radiation, or heat transfer from a surface through electromagnetic radiation, can be quantified by equation (2) below:

$$q_{rad} = \varepsilon A \sigma (T_s^4 - T_{surr}^4) \tag{2}$$

For equation (2), $q_{rad}$ represents a rate of heat transfer through radiation (e.g., in W), ε represents emissivity (dimensionless), σ represents the Stefen-Boltzmann constant (e.g., σ=5.67×10⁻⁸ W/(m²·K⁴)), $T_s$ represents a temperature of a surface (e.g., in K or ° C.), and $T_{surr}$ represents a temperature of surroundings of the surface (e.g., in K or ° C.). The term A represents an area of the surface (e.g., in m²).

Conduction, or heat transfer through a solid body through atomic and molecular activity, can be quantified by equation (3) below:

$$q_{cond} = -kA\frac{dT}{dx} \tag{3}$$

For equation (3), $q_{cond}$ represents a rate of heat transfer in a solid material through conduction (e.g., in W), k represents a thermal conductivity of the solid material (e.g., in W/(m·K)), and dT/dx represents a temperature gradient through the solid material (e.g., in K/m or ° C./m). The term A represents a cross-sectional area of the solid material (e.g., in m²).

For an electronic product, heat transfer between components may occur using one or more of the heat transfer mechanisms described above. In general, and in accordance with equations (1) and (2), heat transfer can be varied by increasing or decreasing surface areas for convection and/or radiation within the electronic device (e.g., increasing or decreasing surface areas of heat-spreading mechanisms). Furthermore, and in accordance with equation (3), heat transfer can be varied by increasing or decreasing an effective cross-sectional for conduction of heat through a solid material (e.g., increasing or decreasing a cross-sectional area of lamination between a heat-spreading mechanism and a surface of a housing component). In general, the heat-spreading mechanism may absorb heat through convection and/or radiation heat transfer mechanisms and then transfer the heat to the surface of the housing component through conduction heat transfer mechanisms.

Elastic flexure in a body, in general, can be quantified by equation (4) below:

$$\sigma_x = \frac{My}{I} \tag{4}$$

The term M represents a bending moment (e.g., in Newtons (N)·m) applied to the body, y is a location of a point within the body (e.g., a distance from a bending axis, in m), and I is a moment of inertia (e.g., in m⁴) of a cross-sectional area containing y. The term $\sigma_x$ represents a stress that is normal to a bending axis of the body at location y (e.g., in N/m²). In a material stack having different layers of materials, $\sigma_x$ may also be considered an interlaminar stress. In general, and by increasing the moment of inertia I of the body (e.g., increasing the cross-sectional area of the body), the normal stress $\sigma_x$ at the location y may be reduced.

In an instance where an electronic device includes a heat-spreading mechanism that is laminated to a non-planar surface (e.g., a curved surface of a housing), and in accordance with equation (4), stresses due to bending of the heat-spreading mechanism may be varied by increasing or decreasing cross-sectional areas of materials within the heat-spreading mechanism. Decreasing stresses may, in turn, reduce displacements that lead to wrinkling and delamination of the heat-spreading mechanism from the surface to which it is mounted and improve heat transfer performance.

Thermal expansion, in general, may be quantified by equation (5) below:

$$\delta_T = \alpha(\Delta T)L \quad (5)$$

The term $\delta_T$ represents a displacement (e.g., in m) that may be induced into a body because of a temperature change. The term a corresponds to a CTE of a material forming the body and refers to a fractional change in a size of the body in response to the change in temperature and is measured as an inverse to the change in temperature (e.g., in 1/K or 1/° C.). Other elements of equation (5) include changes in temperature (e.g., $\Delta T$ in K or ° C.) and a nominal dimension or length L (e.g., in m).

In an instance where an electronic device with an attached heat-spreading mechanism undergoes thermal cycling, either as part of a testing operation or while being used in the field, mismatches in thermal displacements may be introduced in accordance with equation (5) due to variances in CTEs (e.g., variances in CTEs that may form the heat-spreading mechanism, materials that may form the housing component of the electronic device). Such mismatches may cause wrinkling, bubbles, or gap regions between the heat-spreading mechanism and a surface of the housing component and compromise heat transfer performance. If the heat-spreading mechanism has different layers of materials, mismatches in thermal displacements may contribute to interlaminar stresses and further delamination of the heat-spreading mechanism from the surface of the housing component.

As can be seen above, there are many factors that can impact thermal performance of the heat-spreading mechanism. In an instance where the heat-spreading mechanism may be attached to a curved surface and subjected to thermal cycling, the problem is further complicated. In addition to the above-mentioned stress and thermal expansion considerations, outgassing (e.g., gasses that may be expelled from a plastic housing to which the heat-spreading mechanism is attached) may cause bubbling and further exacerbate delamination issues.

The reinforced graphite heat-spreader, as described herein, improves heat transfer (e.g., rates and/or quantities of heat transfer through conduction, convection, and/or radiation in accordance with equations (1)-(3)). Furthermore, and in accordance with equations (4) and (5), the reinforced graphite heat-spreader reduces interlaminar stresses that may be introduced through bending and/or thermal expansion. The reinforced graphite heat-spreader also mitigates outgassing that may be expelled from the housing component during thermal cycling of an electronic apparatus. In general, features of the reinforced graphite heat-spreader reduce delamination and improve overall heat transfer performance.

Although techniques using and apparatuses for the reinforced graphite heat-spreader are described, it is to be understood that the subject of the appended claims is not necessarily thresholded to the specific features or methods described. Rather, the specific features and methods are disclosed as example ways in the reinforced graphite heat-spreader can be implemented.

Operating Environment

Figure 1:
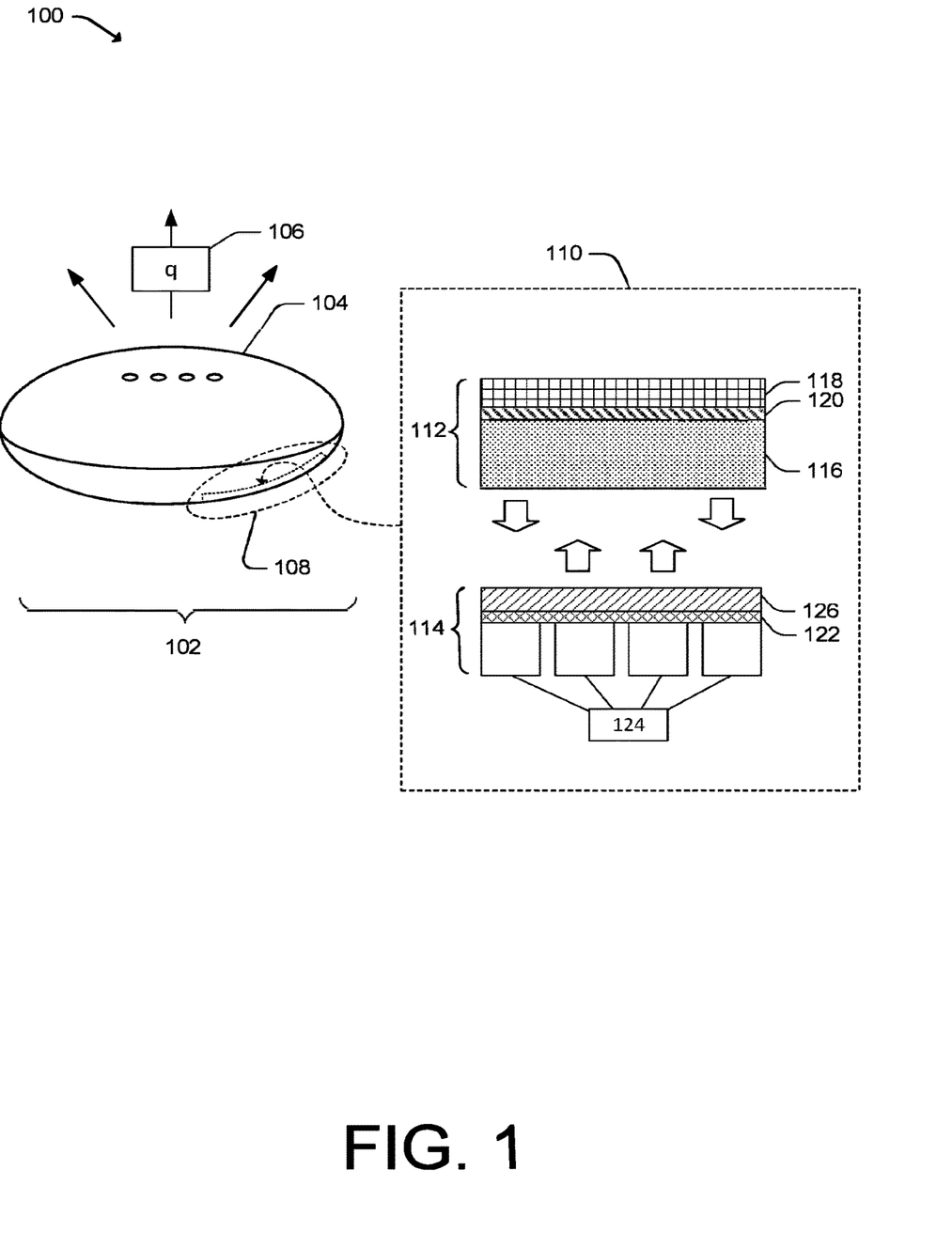
FIG. 1 illustrates an example operating environment in which aspects of a reinforced graphite heat-spreader laminated to a surface of a housing component of an electronic device can be implemented.

FIG. 1 illustrates an example operating environment 100 in which aspects of a reinforced graphite heat-spreader laminated to a surface of a housing component of an electronic device can be implemented. In the operating environment 100, an example electronic device 102 is dissipating, through a housing component 104 of the electronic device 102, heat 106 at a rate q (e.g., transferring q W of heat through convection and/or radiation to the operating environment 100). The heat 106 may, in certain instances, originate with one or more heat-generating devices in the electronic device 102 (e.g., a processor integrated circuit (IC) device, a power supply, communication hardware). Furthermore, and although the electronic device 102 illustrated is a smart-speaker device, the electronic device 102 may be another type of electronic device having a housing (e.g., a television, a computer, a laptop, a router, a smartphone) and one or more heat-generating devices.

The electronic device 102, as illustrated, includes a non-planar surface region 108 that is interior to the housing. Although FIG. 1 illustrates the non-planar surface region 108 as interior to the electronic device 102, in other instances it may be planar and/or exterior to the electronic device 102.

The electronic device 102 includes a reinforced graphite heat-spreader 110 having two material stacks (e.g., a heat-spreader material stack 112 joined to an interface material stack 114). The heat-spreader material stack 112 includes a layer of a graphite material 116 that enables the heat-spreader material stack 112 to function as a heat spreader. The heat-spreader material stack 112 also includes a layer of a polymer material 118 and a layer of an adhesive material 120 located between the layer of the polymer material 118 and the layer of the graphite material 116. In some instances, the layer of the polymer material 118 may include a polyethylene terephthalate (PET) material, while the layer of the adhesive material 120 may include a pressure-sensitive adhesive (PSA) material.

The interface material stack 114 includes a layer of a polymer material 122. Within the interface material stack 114, a matrix of protuberances 124 is formed on, and extends from, a first side of the layer of the polymer material 122. Also, and within the interface material stack 114, a layer of an adhesive material 126 is formed on, and extends from, a second side of the layer of the polymer material 122. The layer of the adhesive material 126 may join the heat-spreader material stack 112 to the interface material stack 114. In some instances, the layer of the polymer material 122 may include a PET material, while the layer of the adhesive material 126 may include a PSA material.

Example Reinforced Graphite Heat-Spreaders

Figure 2:
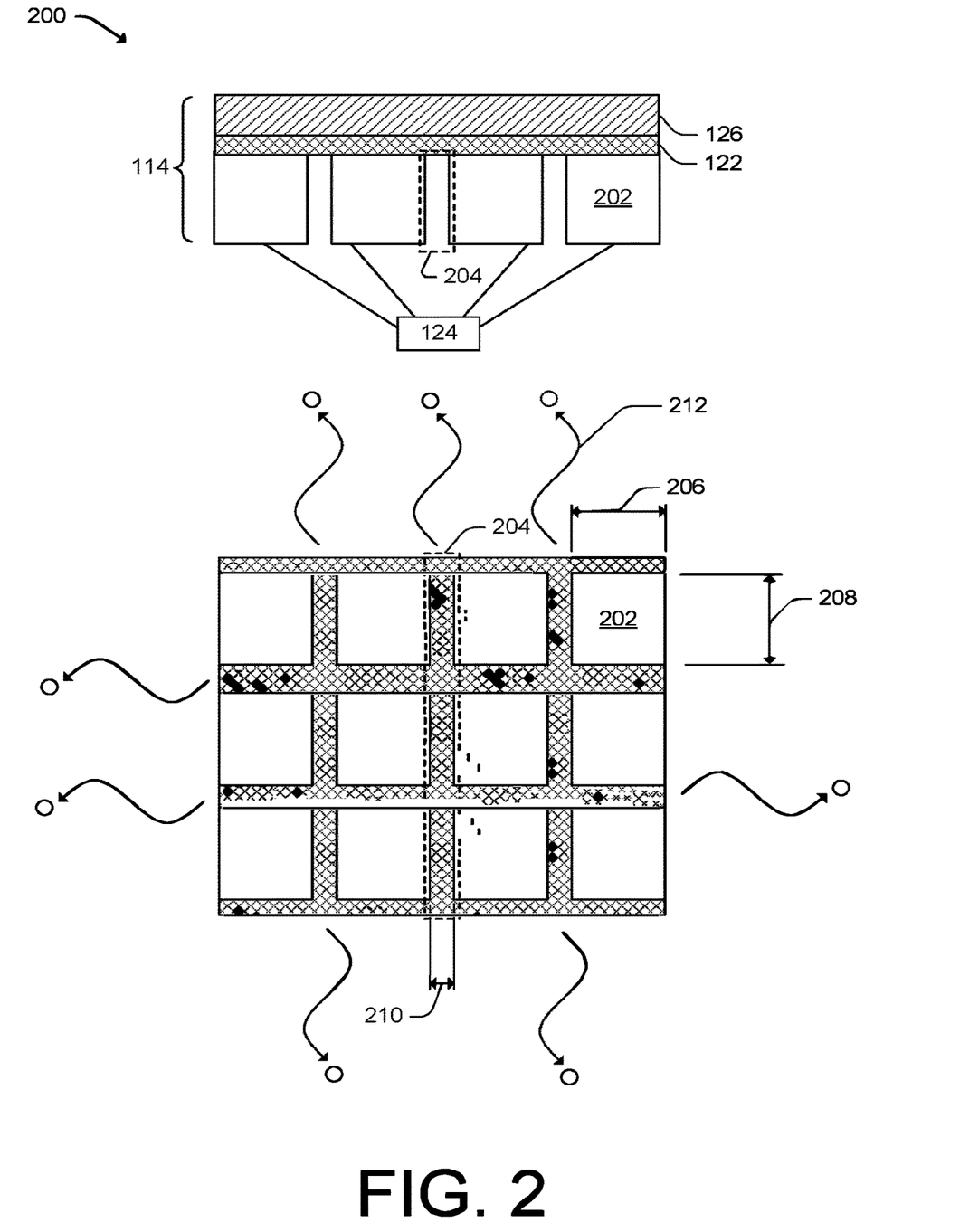
FIG. 2 illustrates details of an example interface material stack having a matrix of protuberances.

FIG. 2 illustrates details 200 of an example interface material stack, including a matrix of protuberances. In some instances, the example material stack may be the interface material stack 114 of FIG. 1. For illustrative purposes and in relation to example dimensions cited below, features included in FIG. 2 are not drawn to scale.

The top of FIG. 2 illustrates a side view of the interface material stack 114, including the matrix of protuberances 124, including a protuberance 202 that is representative of each protuberance within the matrix of protuberances 124.

The top of FIG. 2 also illustrates an air channel 204 that is representative of each air channel in a pattern of air channels.

The bottom of FIG. 2 illustrates a bottom view of the interface material stack 114, including the matrix of protuberances 124. Although the bottom view of FIG. 2 illustrates an "M×N" matrix of protuberances 124 that includes three rows and four columns, the matrix of protuberances 124 may be nearly any configuration of a matrix (e.g., a single row matrix, a single column matrix, a dual row matrix, etc.).

Each protuberance 202 of the matrix of protuberances 124 may have a footprint measuring to a nominal width 206 and a nominal length 208. In some instances, the nominal width 206 and the nominal length 208 may be generally equal. In other instances, the nominal width 206 and the nominal length 208 may not be generally equal. As example dimensions, the nominal width 206 of the protuberance 202 may measure between approximately 0.50 millimeters (mm) to approximately 0.70 mm while the nominal length 208 of the protuberance 202 may measure between approximately 0.50 mm to approximately 0.70 mm.

Furthermore, a pattern of air channels (e.g., a pattern using multiples of the air channel 204) may separate protuberances of the matrix of protuberances 124 from one another. The pattern of air channels may extend to, and exit from, external edges of the interface material stack 114. As an example dimension, a nominal width 210 of the air channel 204 may measure between approximately 0.10 mm to approximately 0.30 mm.

The matrix of protuberances 124 may join a non-planar surface region of a housing component (e.g., the non-planar surface region 108 of the housing component 104 as illustrated in FIG. 1) to the first side of the layer of the polymer material 122. If the housing component is formed from a plastic material, the plastic material may expel gases 212 through outgassing during a thermal-cycling condition. In general, the pattern of air channels may serve as a conduit for the gases 212 to exit from between the non-planar surface region of the housing component and the interface material stack 114, effective to reduce a formation of bubbles or gaps between the interface material stack 114 and the non-planar surface region of the housing component.

Figure 3:
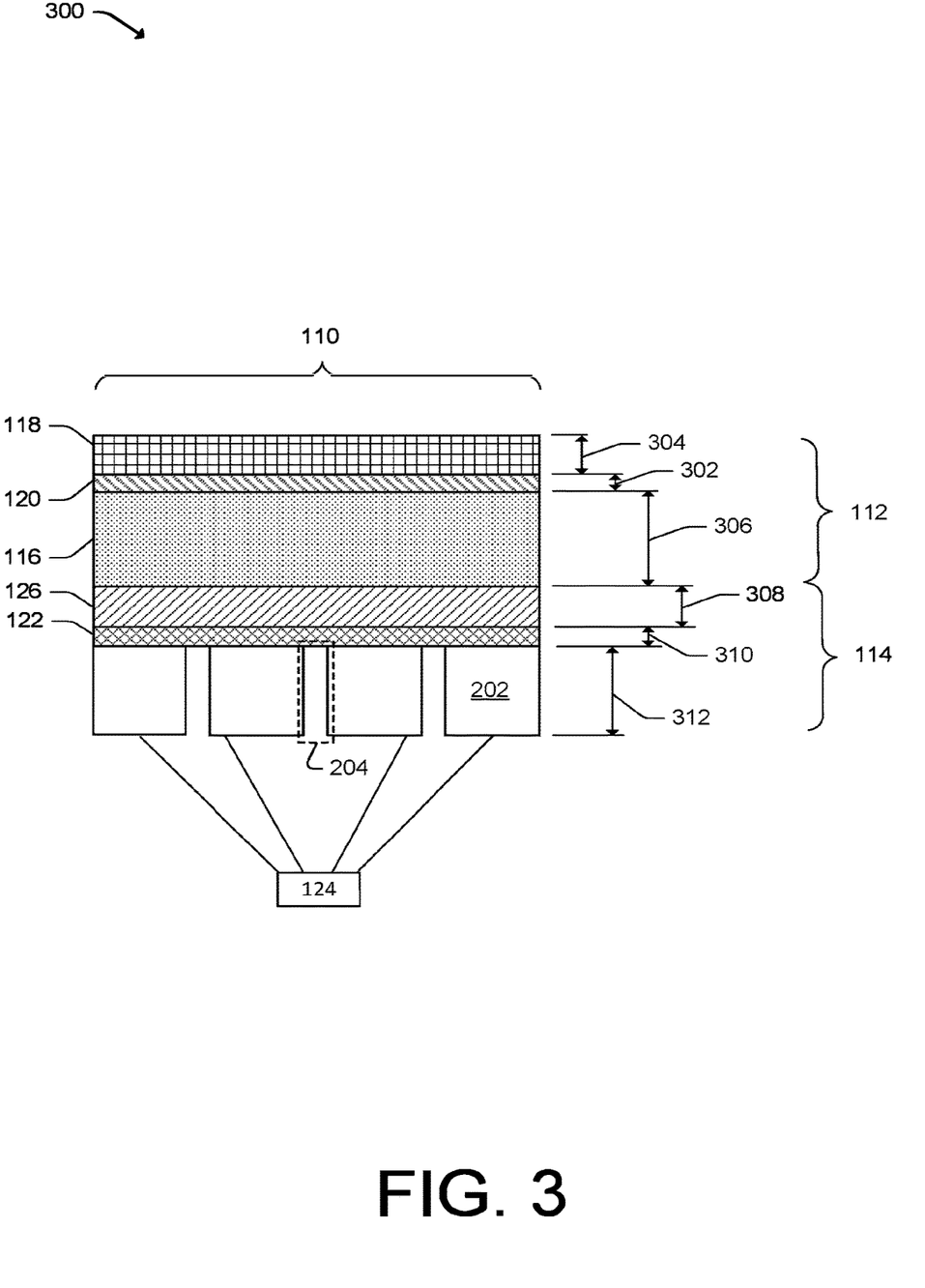
FIG. 3 illustrates details of a reinforced graphite heat-spreader including a heat-spreader material stack joined to an interface material stack.

FIG. 3 illustrates details 300 of a reinforced graphite heat-spreader including a heat-spreader material stack joined to an interface material stack. The reinforced graphite heat-spreader may be the reinforced graphite heat-spreader 110 of FIG. 1, incorporating features of FIGS. 1 and 2, including the heat-spreader material stack 112 joined to the interface material stack 114. For illustrative purposes and in relation to example dimensions cited below, features included in FIG. 3 are not drawn to scale.

The heat-spreader material stack 112 includes the layer of the graphite material 116 that enables the heat-spreader material stack 112 to function as a heat spreader. The heat-spreader material stack 112 also includes the layer of the polymer material 118 and the layer of the adhesive material 120. In some instances, and for purposes of achieving desired flexure properties of the reinforced graphite heat-spreader 110, a nominal thickness 302 of the layer of the adhesive material 120 may be approximately one-half of another nominal thickness 304 of the layer of the polymer material 118. As example dimensions, and in such an instance, the nominal thickness 302 of the layer of the adhesive material 120 may measure between approximately 4 microns (μm) and approximately 6 μm while the other nominal thickness 304 of the layer of the polymer material 118 may measure between approximately 8 μm and approximately 12 μm.

Within the heat-spreader material stack 112, the layer of the graphite material 116 may have a nominal thickness 306. As example dimensions, the nominal thickness 306 may measure between approximately 28 μm and approximately 32 μm.

Within the interface material stack 114, the layer of the adhesive material 126 may have a nominal thickness 308. As example dimensions, the nominal thickness 308 may measure between approximately 8 μm and approximately 12 μm.

Within the interface material stack 114, the layer of the polymer material 122 may have a nominal thickness 310. As example dimensions, the nominal thickness 310 may measure between approximately 4 μm and approximately 6 μm.

Within the interface material stack 114, the protuberance 202 (e.g., the matrix of protuberances 124) may have a nominal thickness 312. As example dimensions, the nominal thickness 312 may measure between approximately 14 μm and approximately 18 μm. In some instances, a depth of the air channel 204 will correspond to the nominal thickness 312. In other instances, the depth of the air channel 204 may be less than the nominal thickness 312 (e.g., if a residual material from a process that fabricates the matrix of protuberances 124 remains in the air channel 204, the depth of the air channel 204 may be less).

Figure 4:
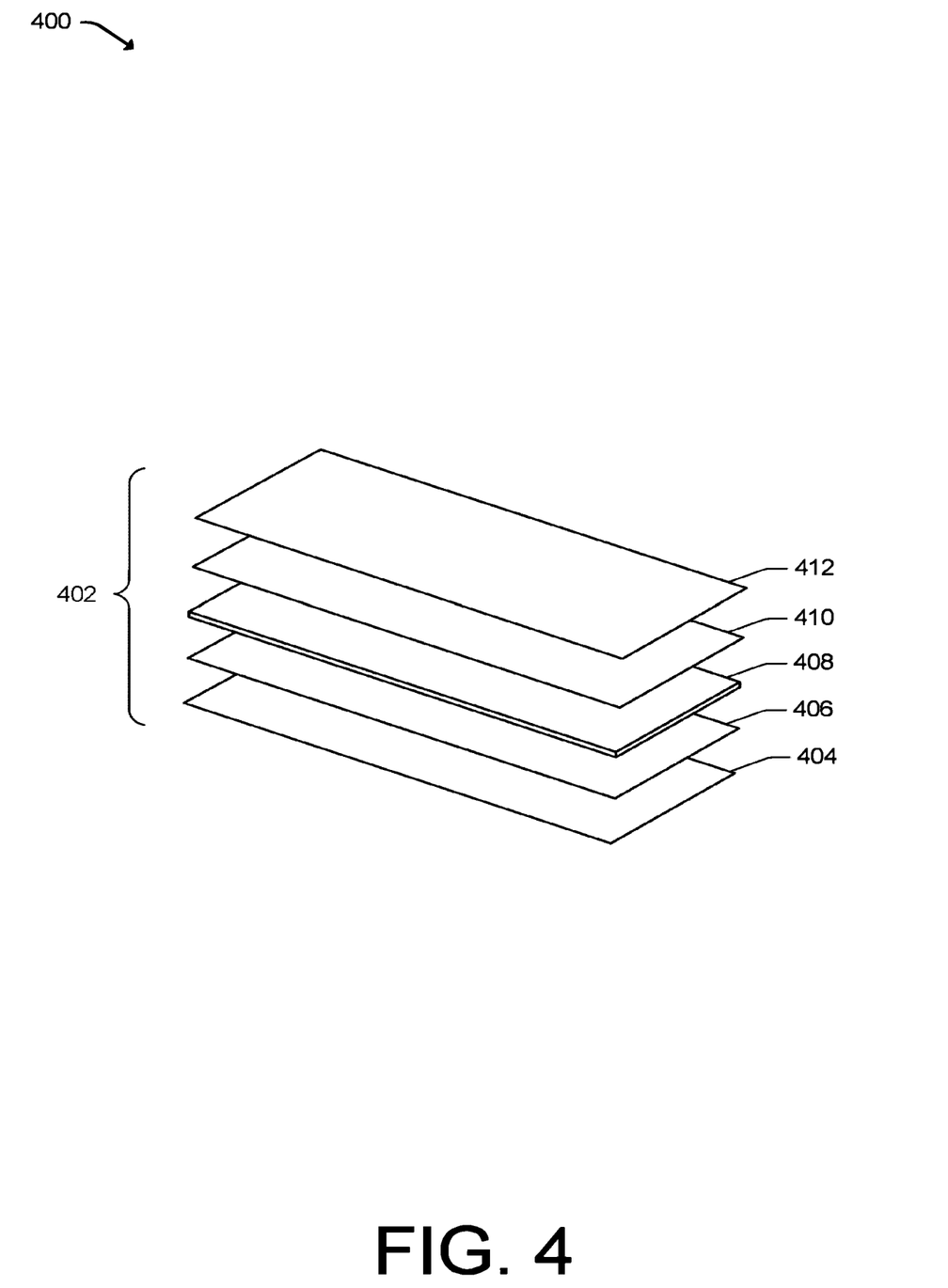
FIG. 4 illustrates details of an example reinforced single-layer graphite heat spreader in accordance with one or more aspects.

FIG. 4 illustrates details 400 of an example reinforced single-layer graphite heat spreader having multiple layers in accordance with one or more aspects. The reinforced single-layer graphite heat spreader may include features referenced in FIGS. 1-3.

As illustrated, a reinforced single-layer graphite heat spreader 402 (e.g., a reinforced heat spreader with a single layer of graphite) includes multiple structural layers. The reinforced single-layer graphite heat spreader 402 includes a first removable-liner layer 404 and an interface layer 406. In some instances, the interface layer 406 may include the interface material stack 114 (as illustrated in FIGS. 1-3). The reinforced single-layer graphite heat spreader 402 also includes a graphite layer 408. In some instances, the graphite layer 408 may include the layer of the graphite material 116 (as illustrated in FIGS. 1-3).

The reinforced single-layer graphite heat spreader 402 also includes a protective layer 410. In some instances, the protective layer 410 may include the layer of the polymer material 118 and the layer of the adhesive material 120 (as illustrated in FIGS. 1 and 3). In general, the graphite layer 408 and the protective layer 410 may combine to form the heat-spreader material stack 112 (as described by FIGS. 1 and 3). The reinforced single-layer graphite heat spreader 402 also includes a second removable-liner layer 412.

Figure 5:
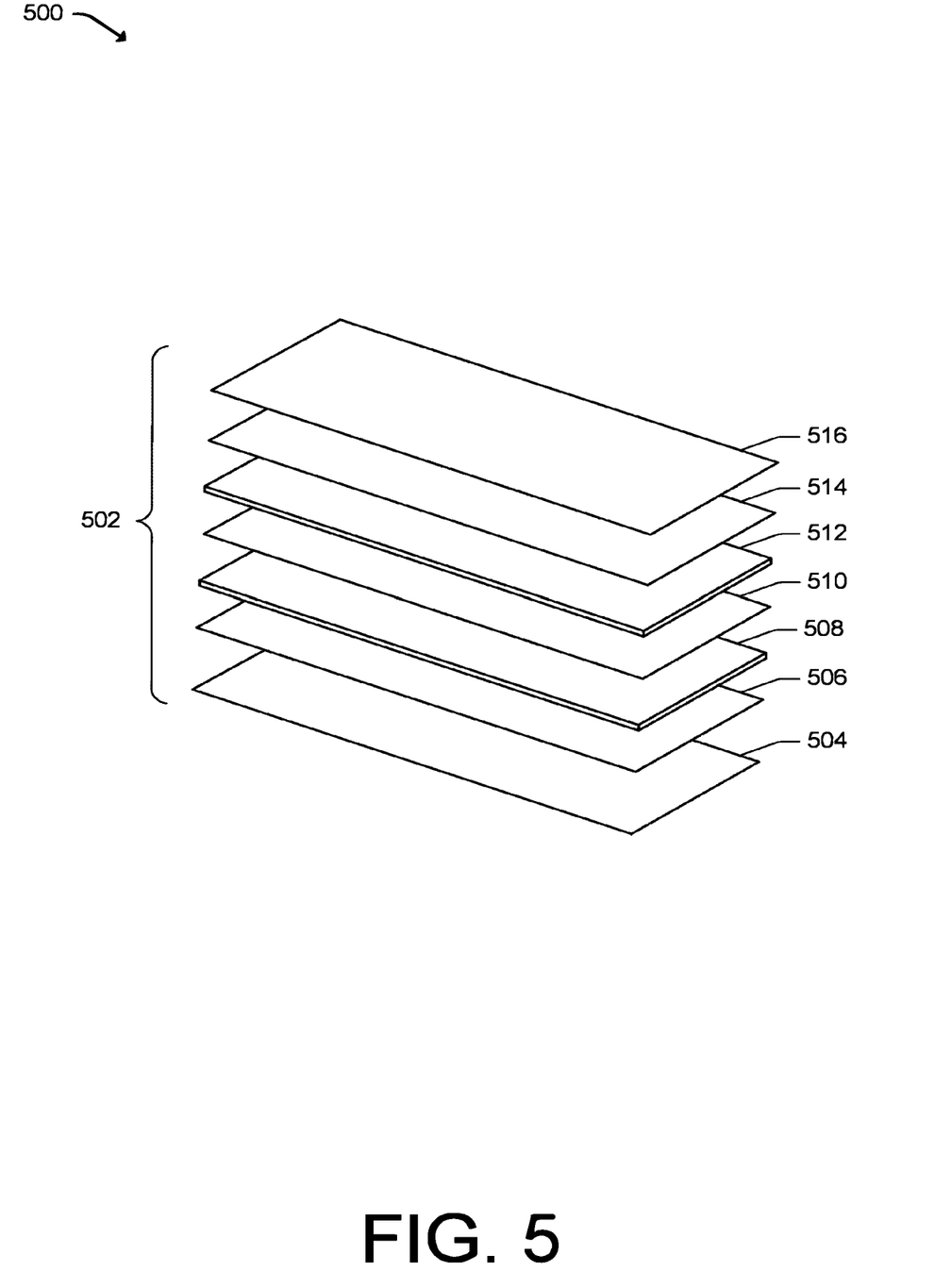
FIG. 5 illustrates details of an example reinforced dual-layer graphite heat spreader in accordance with one or more aspects.

FIG. 5 illustrates details 500 of an example reinforced double-layer graphite heat spreader having multiple layers in accordance with one or more aspects. The reinforced double-layer graphite heat spreader may include features referenced in FIGS. 1-3.

As illustrated, a reinforced double-layer graphite heat spreader 502 (e.g., a reinforced heat spreader with a single layer of graphite) includes multiple structural layers. The reinforced double-layer graphite heat spreader 502 includes a first removable-liner layer 504 and an interface layer 506. In some instances, the interface layer 506 may include the interface material stack 114 of FIGS. 1-3 (not illustrated in FIG. 5). The reinforced double-layer graphite heat spreader 502 also includes a first graphite layer 508. In some instances, the first graphite layer 508 may include the layer of the graphite material 116 of FIGS. 1 and 3 (not illustrated in FIG. 5).

The reinforced double-layer graphite heat spreader 502 also includes an adhesion layer 510. The adhesion layer 510, in some instances, may include a double-coated PSA material having a nominal thickness that measures between approximately 8 μm and approximately 12 μm. The reinforced double-layer graphite heat spreader 502 also includes a second graphite layer 512. In some instances, the second graphite layer 512 may include the layer of the graphite material 116 of FIGS. 1 and 3 (not illustrated in FIG. 5)

The reinforced double-layer graphite heat spreader 502 also includes a protective layer 514. In some instances, the protective layer 514 may include the layer of the polymer material 118 and the layer of the adhesive material 120 of FIG. 1 (not illustrated in FIG. 5). In general, the graphite layer 512 and the protective layer 514 may combine to form the heat-spreader material stack 112 (as illustrated in FIG. 1). The reinforced double-layer graphite heat spreader 502 also includes a second removable-liner layer 516.

Figure 6:
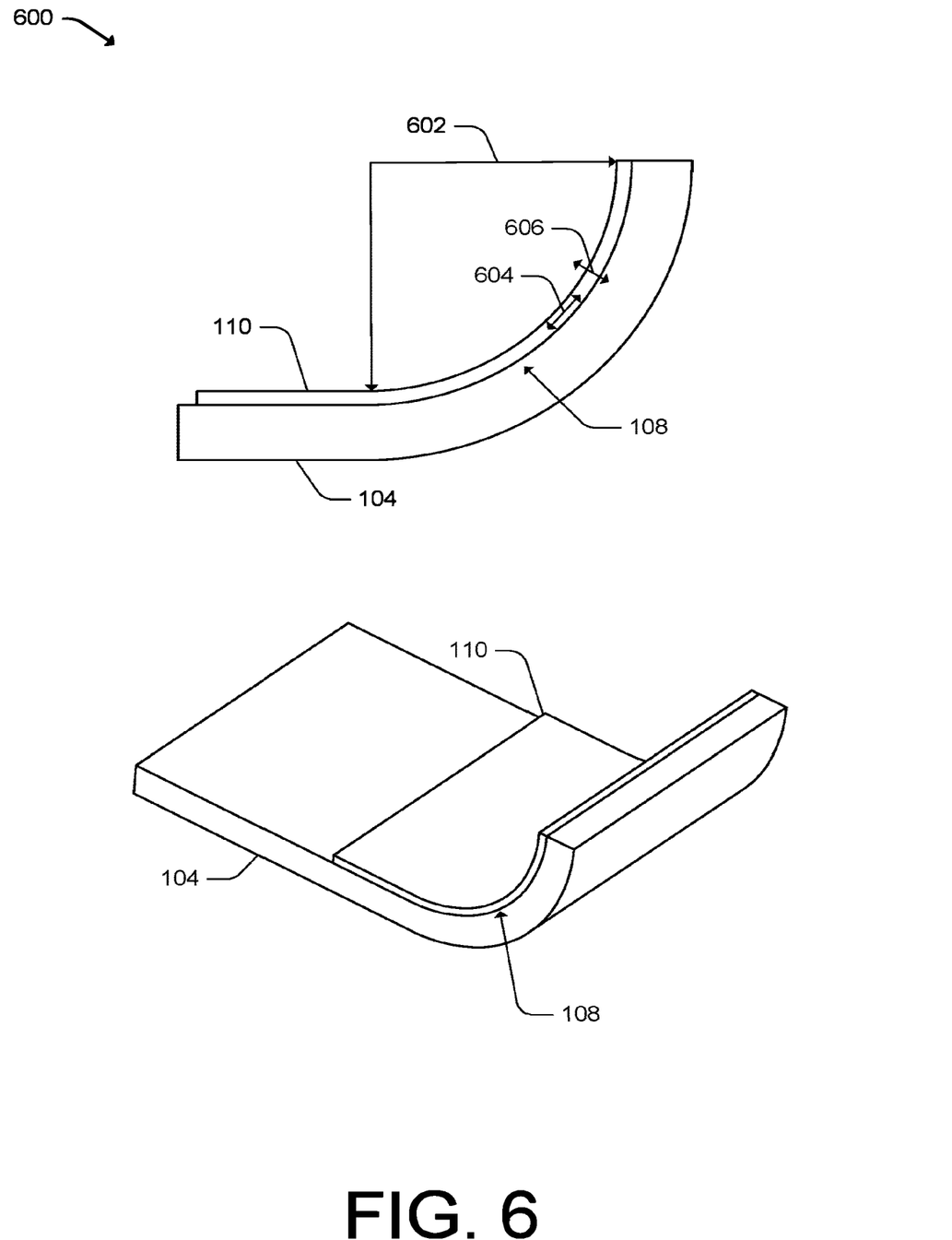
FIG. 6 illustrates details of an example reinforced graphite heat-spreader being attached to a non-planar surface.

FIG. 6 illustrates details 600 of an example reinforced graphite heat-spreader being attached to a non-planar surface region. The reinforced graphite heat-spreader may be the reinforced graphite heat-spreader 110 of FIG. 1.

The upper illustration of FIG. 6 illustrates a side view of the reinforced graphite heat-spreader 110 attached to the non-planar surface region 108 (e.g., the non-planar surface region 108 of the housing component 104). The non-planar surface region 108 has a radius of curvature 602. The radius of curvature 602 may introduce a bending moment that produces tangential stresses 604 and radial stresses 606 (e.g., interlaminar stresses) within the reinforced graphite heat-spreader 110, introducing a potential for delamination. However, as discussed above, a ratio of thicknesses of material within the reinforced graphite heat-spreader 110 (e.g., a ratio of the nominal thickness 302 of the adhesive material 120 to the nominal thickness 304 of the polymer material 118, not illustrated in FIG. 5) may be selected (e.g., a 1:2 ratio) to alter a moment of inertia of the reinforced graphite heat-spreader and mitigate interlaminar stresses.

The lower illustration of FIG. 6 illustrates an isometric view of the reinforced graphite heat-spreader 110 attached to the non-planar surface region 108 of the housing component 104.

Example Techniques and Methods

Figure 7:
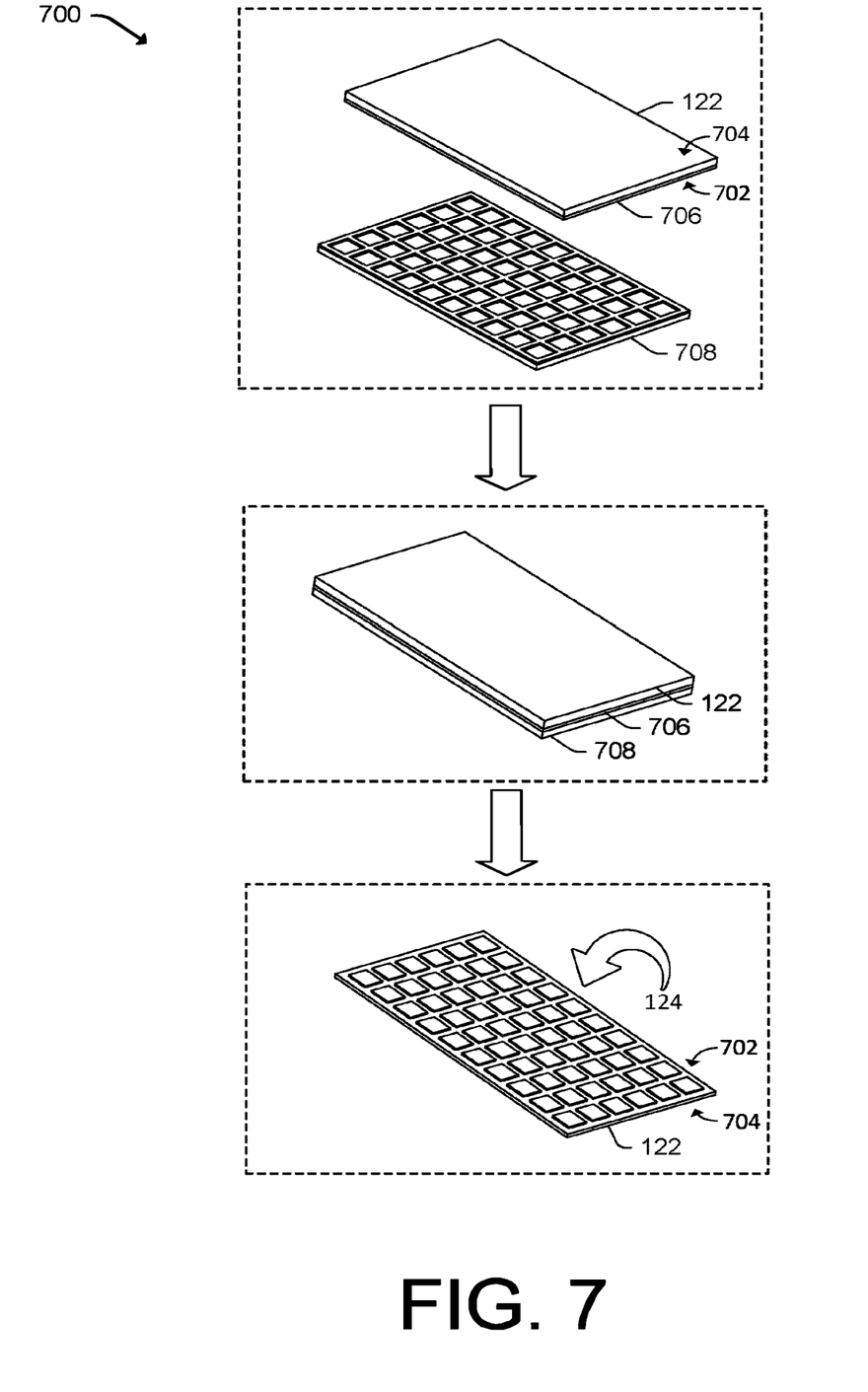
FIG. 7 illustrates details of an example embossing technique that may be used to form a matrix of protuberances in accordance with one or more aspects.

FIG. 7 illustrates details 700 of an example embossing technique that may be used to form a matrix of protuberances in accordance with one or more aspects. The matrix of protuberances may be the matrix of protuberances 124 of FIG. 1.

The top illustration of FIG. 7 illustrates a layer of a polymer material (e.g., the layer of the second polymer material 122 of FIG. 1) having a first side 702 and a second side 704. A layer of an adhesive material 706 has been coated to the first side 702 of the layer of the second polymer material 122. The layer of the adhesive material 706 may include a PSA material. Furthermore, the layer of the adhesive material 706, in some instances, may be cured in accordance with a curing profile. An example curing profile may include curing the layer of the adhesive material 706 at a nominal temperature that is between approximately 16° C. and approximately 24° C. for a duration that is greater than approximately 72 hours.

The upper illustration of FIG. 7 also illustrates an embossing liner 708. The embossing liner includes a raised pattern (e.g., a raised pattern corresponding to one or more air channels such as the air channel 204 of FIG. 2, not illustrated in FIG. 7).

The middle illustration of FIG. 7 illustrates the embossing liner 708 mating into the cured layer of the adhesive material 706. After mating the embossing liner 708 into the cured layer of the adhesive material 706, the embossing liner 708 is removed.

The lower illustration of FIG. 7 illustrates the matrix of protuberances 124 that are a product of the embossing technique. In the lower illustration, the layer of the second polymer material 122 has been "flipped" to reveal the matrix of protuberances 124 that extends from the first side 702. The second side 704 remains exposed.

Figure 8:
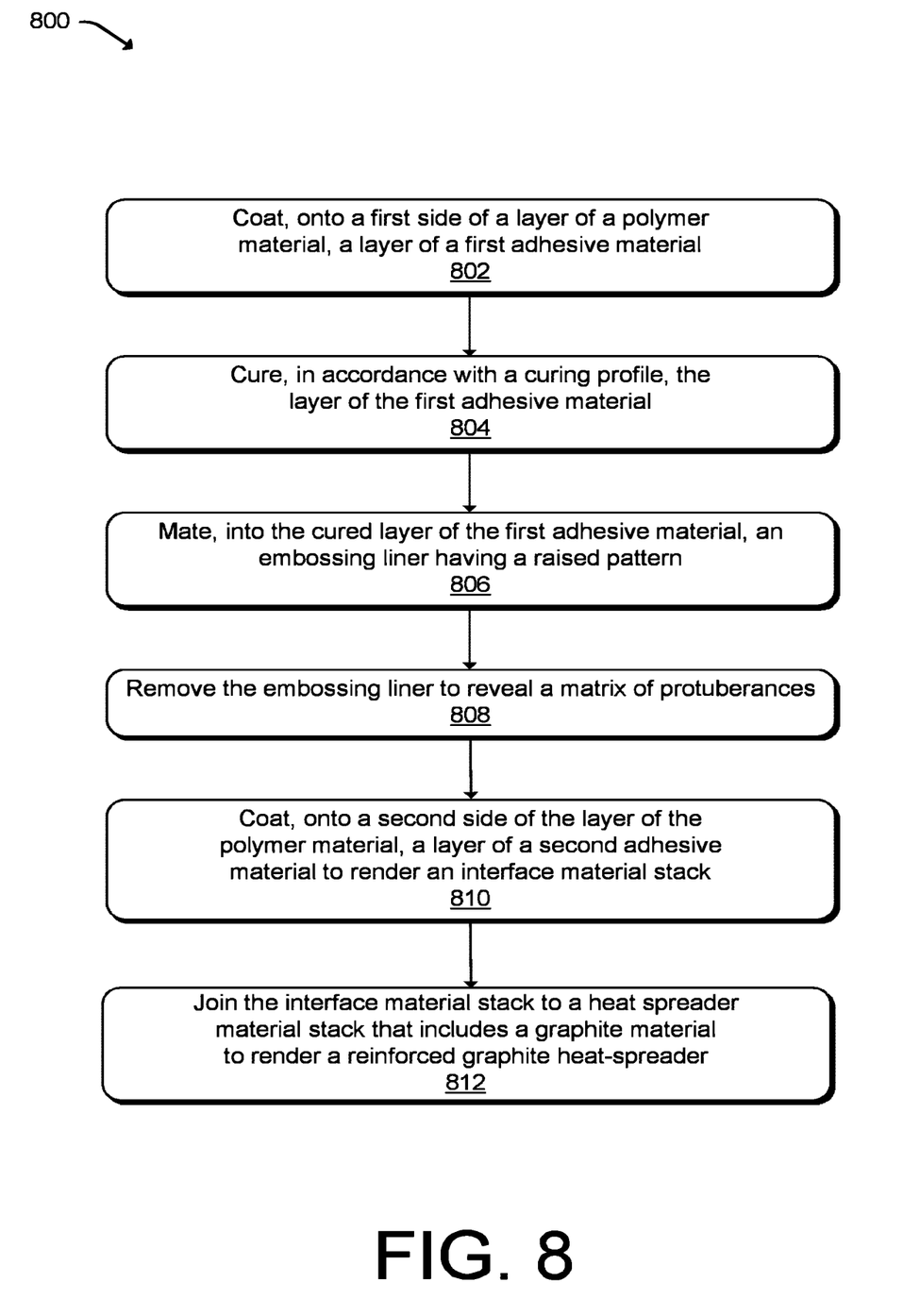
FIG. 8 illustrates an example method of forming a reinforced graphite heat-spreader in accordance with one or more aspects.

FIG. 8 illustrates an example method 800 of forming a reinforced graphite heat-spreader in accordance with one or more aspects. Operations of the method 800 are described in a series of blocks 802-812 and are not limited to the order or sequence as described below. Furthermore, the example method 800 may utilize elements of FIGS. 1 and 7.

At operation 802, a layer of a first adhesive material is coated onto a first side of a layer of a polymer material (e.g., the layer of the adhesive material 706 is coated onto the first side 702 of the layer of the polymer material 122, not illustrated in FIG. 8). In some instances, the layer of the first adhesive material may be a PSA material.

At operation 804, the layer of the first adhesive material is cured in accordance with a curing profile. The curing profile may be defined by a nominal temperature and duration, wherein the nominal temperature is between approximately 16° C. and approximately 24° C., and the duration is greater than approximately 72 hours.

At operation 806, an embossing liner having a raised pattern may be mated into the cured layer of the first adhesive material (e.g., the embossing liner 708 is mated into the cured layer of the adhesive material 706, not illustrated in FIG. 8). At operation 808, the embossing liner is removed to reveal the matrix of protuberances (e.g., the embossing liner 708 is removed to reveal the matrix of protuberances 124, not illustrated in FIG. 8).

At operation 810, a layer of a second adhesive material is coated onto a second side of the layer of the polymer material to render an interface material stack (e.g., the layer of the adhesive material 126 may be coated onto the second side 704 of the layer of the polymer material 122 to render the interface material stack 114, not illustrated in FIG. 8).

At operation 812 and using the layer of the second adhesive material, the interface material stack is joined to a heat-spreader material stack that includes a graphite material to render a reinforced graphite heat-spreader (e.g., using the layer of the adhesive material 126, the interface material stack 114 is joined to the heat-spreader material stack 112 to render the reinforced graphite heat-spreader 110, not illustrated in FIG. 8).

Additional Examples

Figure 9:
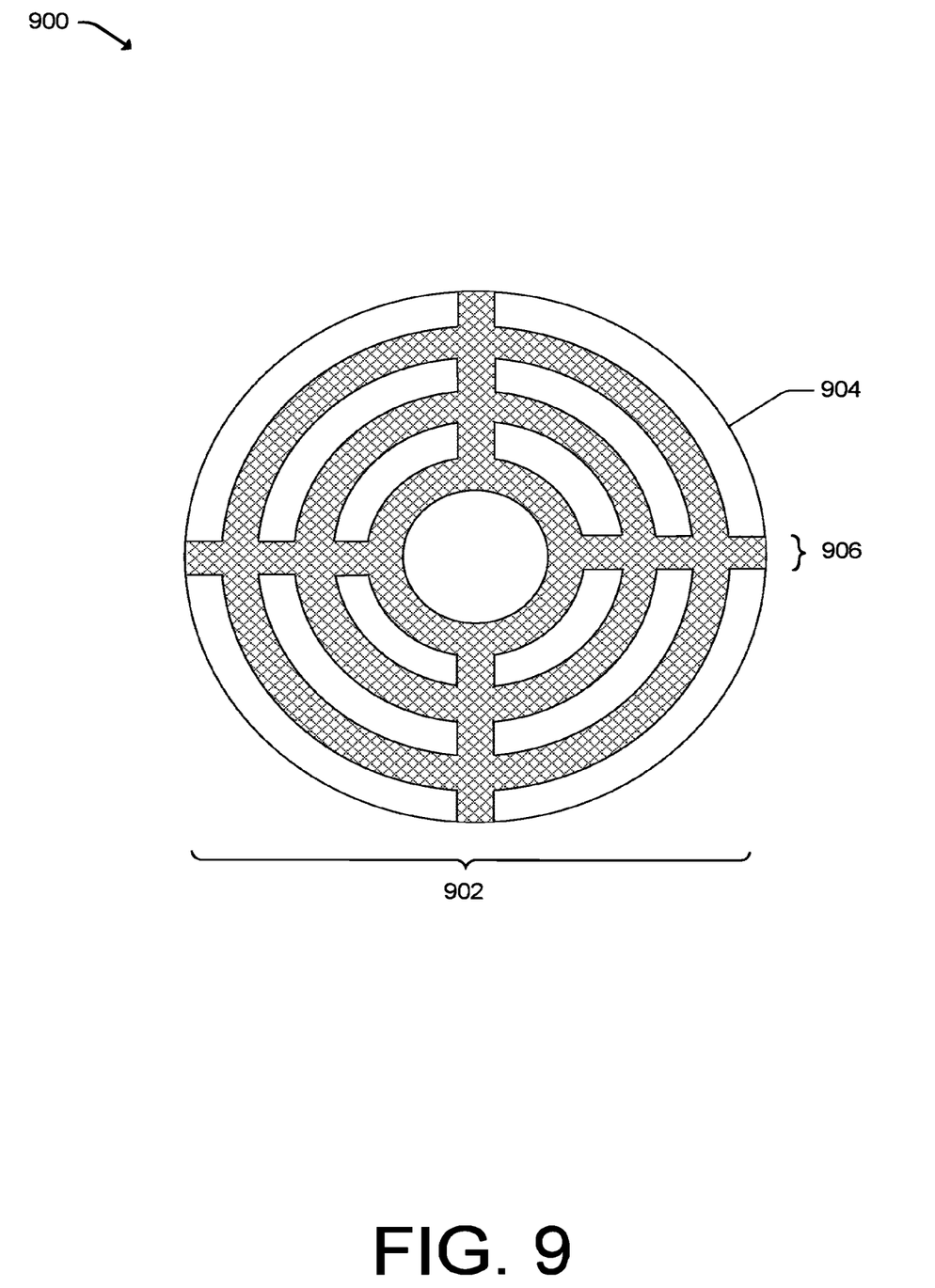
FIG. 9 illustrates details of another example reinforced graphite heat-spreader in accordance with one or more aspects.

FIG. 9 illustrates details 900 of another example reinforced graphite heat-spreader in accordance with one or more aspects. FIG. 9, a bottom view, illustrates a reinforced graphite heat-spreader 902 that is radial in nature.

Rather than a matrix of protuberances that is orthogonal in nature (e.g., the matrix of protuberances 124 as illustrated in FIG. 2, an "M×N" matrix), the reinforced graphite heat spreader 902 includes a radial pattern of one or more protuberance(s) 904 and one or more air channel(s) 906. The radial pattern of protuberances 904 may be formed from a PSA material.

Furthermore, techniques other than embossing may be used to form the radial pattern of protuberances 904. For example, a stenciling process that stencils the radial pattern of protuberances 904 from a PSA material onto a polymer material may be used. As another example, a laser ablation process that ablates the air channels 906 and forms the radial pattern of protuberances 904 from a layer of a PSA material may be used.

In general, many patterns of protuberances are possible. Additionally, and in general, techniques other than embossing may be used to form a pattern of protuberances, a combination of patterns of protuberances, and/or combinations of individual protuberances from a layer of a PSA material.

Although techniques using and apparatuses for a reinforced graphite heat-spreader are described, it is to be understood that the subject of the appended claims is not necessarily thresholded to the specific features or methods described. Rather, the specific features and methods are disclosed as example ways in which a reinforced graphite heat-spreader can be implemented.

What is claimed is:

1. An electronic apparatus comprising:
a housing having a non-planar surface region; and
a heat-spreader that includes a layer of a first polymer material and a matrix of protuberances joining the non-planar surface region of the housing to the layer of the first polymer material, wherein:
the heat-spreader is laminated to the non-planar surface region of the housing such that the non-planar surface region contacts the matrix of protuberances; and
the heat-spreader absorbs heat and transfers the heat to the non-planar surface region of the housing via contact of the matrix of protuberances with the non-planar surface region through conduction heat transfer.

2. The electronic apparatus of claim 1, wherein the heat-spreader is a reinforced graphite heat-spreader.

3. The electronic apparatus of claim 1, wherein the heat-spreader further comprises a heat-spreader material stack that includes a layer of a graphite material.

4. The electronic apparatus of claim 3, wherein the heat-spreader further comprises an interface material stack that joins the non-planar surface region of the housing to the heat-spreader material stack and wherein the interface material stack includes the first polymer material and the matrix of protuberances.

5. The electronic apparatus of claim 4, wherein the layer of the first polymer material has a first side and a second side that is opposite the first side and wherein the matrix of protuberances is formed on the first side of the layer of the first polymer material.

6. The electronic apparatus of claim 5, wherein the interface material stack further comprises a layer of a first adhesive material formed on the second side of the layer of the first polymer material that joins the layer of the first polymer material to the layer of the graphite material of the heat-spreader material stack.

7. The electronic apparatus of claim 6, wherein the layer of the first polymer material has a nominal thickness and wherein the layer of the first adhesive material has another nominal thickness that is approximately one-half the nominal thickness of the layer of the first polymer material.

8. An electronic apparatus,
a housing having a non-planar surface region;
a heat-spreader that includes a layer of a first polymer material and a matrix of protuberances joining the non-planar surface region of the housing to the layer of the first polymer material, wherein:
the layer of the first polymer material has a first side and a second side that is opposite the first side and wherein the matrix of protuberances is formed on the first side of the layer of the first polymer material;
an interface material stack that joins the non-planar surface region of the housing to the heat-spreader and wherein the interface material stack includes the first polymer material and the matrix of protuberances;
a layer of a first adhesive material formed on the second side of the layer of the first polymer material that joins the layer of the first polymer material to the heat-spreader, wherein:
the heat-spreader further includes a layer of a second adhesive material and a layer of a second polymer material; and
the layer of the second adhesive material is formed between the layer of a graphite material and the layer of the second polymer material.

9. The electronic apparatus of claim 8, wherein the matrix of protuberances includes a third adhesive material.

10. The electronic apparatus of claim 9, wherein at least one of the first adhesive material, the second adhesive material, and the third adhesive material includes a pressure-sensitive adhesive material.

11. The electronic apparatus of claim 1, wherein the non-planar surface region of the housing includes a plastic material.

12. The electronic apparatus of claim 1, wherein the first polymer material includes a polyethylene terephthalate material.

13. The electronic apparatus of claim 1, wherein each protuberance of the matrix of protuberances measures between approximately 14 microns and approximately 18 microns in nominal thickness.

14. The electronic apparatus of claim 1, wherein a footprint of each protuberance of the matrix of protuberances measures between approximately 0.50 millimeters and approximately 0.70 millimeters in nominal width and measures between approximately 0.50 millimeters and approximately 0.70 millimeters in nominal length.

15. The electronic apparatus of claim 1, wherein a pattern of air channels separates protuberances of the matrix of protuberances from one another, and wherein the pattern of air channels extends to, and exits from, external edges of the layer of the first polymer material.

16. The electronic apparatus of claim 15, wherein each air channel of the pattern of air channels measures between approximately 0.10 millimeters and approximately 0.30 millimeters in nominal width.

17. The electronic apparatus of claim 15, wherein the air channels serve as a conduit for gases to exit, effective to reduce a formation of bubbles or gaps between the layer of the first polymer material and the non-planar surface region of the housing.

18. The electronic apparatus of claim 1, wherein the matrix of protuberances is a single row matrix of protuberances.

19. The electronic apparatus of claim 1, wherein the matrix of protuberances is a single column matrix of protuberances.

20. The electronic apparatus of claim 1, wherein the matrix of protuberances is a dual row matrix of protuberances.

\* \* \* \* \*